(12) United States Patent
Voisin et al.

(10) Patent No.: US 11,610,985 B2
(45) Date of Patent: Mar. 21, 2023

(54) QUANTUM PROCESSING SYSTEM

(71) Applicant: Silicon Quantum Computing Pty Ltd, Sydney (AU)

(72) Inventors: Benoit Voisin, Sydney (AU); Joseph Salfi, Sydney (AU); Sven Rogge, Sydney (AU)

(73) Assignee: Silicon Quantum Computing Pty Ltd.

( * ) Notice: Subject to any disclaimer, the term of this patent is extended or adjusted under 35 U.S.C. 154(b) by 192 days.

(21) Appl. No.: 17/261,329

(22) PCT Filed: Jul. 19, 2019

(86) PCT No.: PCT/AU2019/050758
§ 371 (c)(1),
(2) Date: Jan. 19, 2021

(87) PCT Pub. No.: WO2020/014749
PCT Pub. Date: Jan. 23, 2020

(65) Prior Publication Data
US 2021/0265553 A1    Aug. 26, 2021

(30) Foreign Application Priority Data

Jul. 20, 2018  (AU) ................ 2018902636

(51) Int. Cl.
*G06N 10/00* (2022.01)
*H01L 29/66* (2006.01)
*C01B 33/02* (2006.01)
*H01L 29/04* (2006.01)
*H01L 29/16* (2006.01)
(Continued)

(52) U.S. Cl.
CPC ........ *H01L 29/66984* (2013.01); *C01B 33/02* (2013.01); *G06N 10/40* (2022.01); *H01L 29/045* (2013.01); *H01L 29/16* (2013.01); *H01L 29/36* (2013.01); *H01L 29/423* (2013.01); *H01L 29/66977* (2013.01); *H01L 29/7613* (2013.01); *B82Y 10/00* (2013.01);
(Continued)

(58) Field of Classification Search
CPC ....... G06N 10/40; H01L 29/045; H01L 29/16; H01L 29/36; H01L 29/423; H01L 29/7613
See application file for complete search history.

(56) References Cited

U.S. PATENT DOCUMENTS

2016/0125311 A1    5/2016 Fuechsle et al.

FOREIGN PATENT DOCUMENTS

EP    3300004    3/2018

OTHER PUBLICATIONS

Clark, Robert G., "Toward a silicon-based nuclear-spin quantum computer", Los Alamos Science 27 (200): 284-301.
(Continued)

*Primary Examiner* — Matthew L Reames
(74) *Attorney, Agent, or Firm* — Lee & Hayes, P.C.; Beatrice L. Koempel-Thomas

(57) ABSTRACT

A quantum processing system is disclosed. In one embodiment, a quantum processing system comprises: a plurality of donor atoms positioned in a silicon crystal substrate, each donor atom positioned at a donor site; and a plurality of conductive control electrodes arranged about the donor atoms to operate the donor atoms as qubits. Where, at least two pairs of nearest neighbour donor atoms of the plurality of donor atoms are arranged along the [110] direction of the silicon crystal substrate and are configured to operate as qubits.

20 Claims, 14 Drawing Sheets

(51) Int. Cl.
  *H01L 29/76*  (2006.01)
  *H01L 29/36*  (2006.01)
  *H01L 29/423* (2006.01)
  *G06N 10/40*  (2022.01)
  *B82Y 10/00*  (2011.01)
(52) U.S. Cl.
  CPC ...... *C01P 2002/52* (2013.01); *C01P 2002/77* (2013.01); *C01P 2006/40* (2013.01)

(56) References Cited

OTHER PUBLICATIONS

PCT Search Report for corresponding PCT Application No. PCT/AU2019/050758 dated Aug. 20, 2019, 7 pages.
Salfi, J., et al., "Spatically resolving valley quantum interference of a donor in silicon", Nature materials, 13.6 (2014): 605.

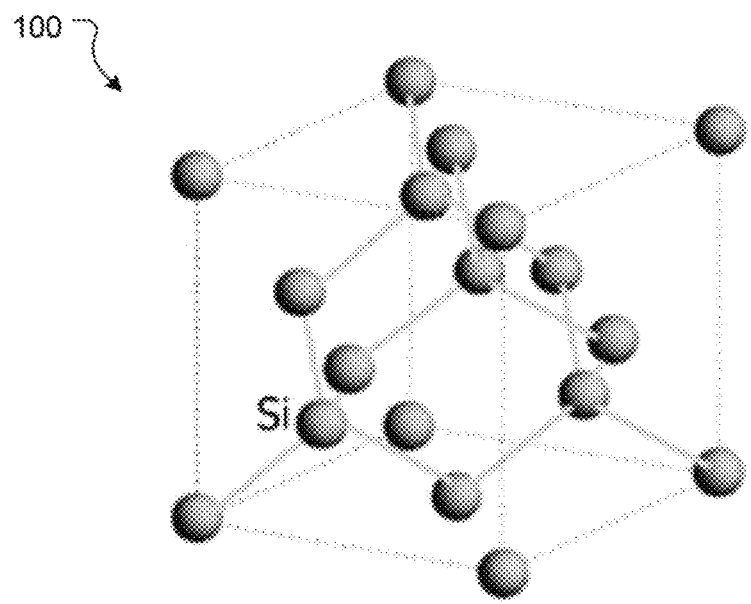
Fig. 1A
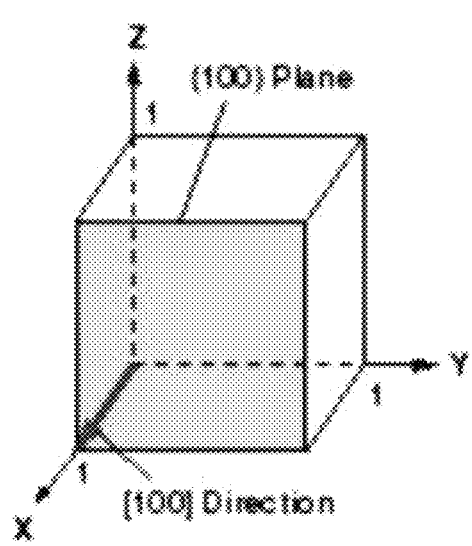 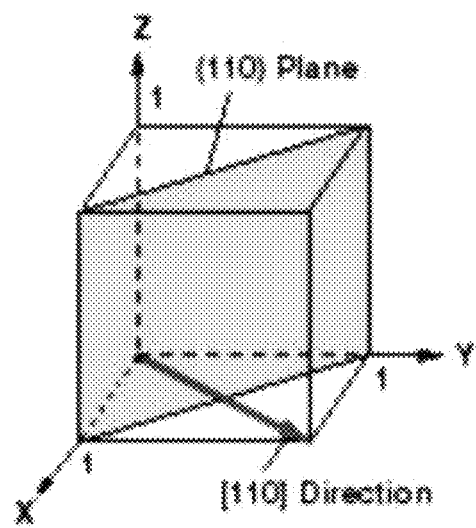
Fig. 1B          Fig. 1C

QUANTUM PROCESSING SYSTEM

This Application is a US National Stage application under 35 USC § 371 of PCT Application PCT/AU2019/050758 filed Jul. 19, 2019, which claims priority to Australia Application 2018902636, filed Jul. 20, 2018, which is incorporated herein by reference.

TECHNICAL FIELD

Aspects of the present disclosure are related to advanced processing systems and methods for operating the same and more particularly, to quantum processing systems which are controllable to perform error corrected quantum computation.

BACKGROUND

The developments described in this section are known to the inventors. However, unless otherwise indicated, it should not be assumed that any of the developments described in this section qualify as prior art merely by virtue of their inclusion in this section, or that those developments are known to a person of ordinary skill in the art.

Large-scale quantum processing systems hold the promise of a technological revolution, with the prospect of solving problems which are out of reach with classical machines. To date, a number of different structures, materials, and architectures have been proposed to implement quantum processing systems and fabricate their basic information units (or quantum bits).

One way of fabricating quantum bits, for example, is to use the nuclear or the electron spin of ionized phosphorus donor atoms in silicon such that each phosphorus donor atom then acts as a quantum bit (or qubit). This fabrication technique offers near perfect qubit state encoding due to the addressability and long coherence of the $^{31}P$ spins. Further, the qubits fabricated in this manner have demonstrated second-long lifetime and benefit from a semiconducting host enabling electrical addressing and high fidelities.

To start seeing the computing advantage that quantum processing systems can offer, however, basic quantum circuits (or quantum gates) need to be fabricated—which is not easy. For example, in the case of single donor atoms in silicon, creating a two-qubit gate requires precise control of the electron-electron exchange interaction between two adjacent donor atoms as well as the hyperfine interaction between the electron and the nuclear spins of the same donor atom. Typically, the electron-electron exchange takes place via the Heisenberg exchange interaction—which is a quantum mechanical effect that occurs between identical particles.

Although Heisenberg exchange interaction is an attractive way for qubits to interact (as it offers a compact route for quantum processors), achieving this interaction consistently and controllably across multiple silicon based quantum bits is often problematic. This is because of quantum interference effects inherent in the silicon band structure and the presence of valley degrees of freedom in silicon. Basically, the crystallographic structure of silicon leads the donor-bound electron charge distribution to oscillate in space around a donor, at a frequency $k_\mu \sim 0.81 k_0$, called the valley frequency, which is non-commensurate with the lattice frequency $k_0$. Notably, two-electron interference occurring at the valley frequency between two electrons bound on two donor atoms, has been predicted to result in the exchange coupling between two donor atoms to oscillate as a function of inter-donor positions, strongly modulating a hydrogen molecule-like exponential decay. Exchange can vary up to 5 orders of magnitude for changes in donor positions of a few lattice sites only, which is critical for quantum computers and simulators. This variation in exchange magnitude can deteriorate two-qubit gate fidelities, prevent the required qubit synchronisation at large scale and spoil many-body effects.

Furthermore, wavefunction engineering options have been proposed, where the electron valley composition of silicon is modified either by coupling to an interface state or by using strained silicon. However concerns have remained about the complex fabrication process that these techniques involve and the impact of interface traps, roughness or strain inhomogeneity on exchange variations, electron coherence, and device reliability.

Accordingly, an improvement is desirable that is compatible with existing device fabrication techniques and where exchange coupling can be stabilized.

SUMMARY

According to a first aspect of the present disclosure, there is provided a quantum processing system comprising: a plurality of donor atoms positioned in a silicon crystal substrate, each donor atom positioned at a donor site; a plurality of conductive control electrodes arranged about the donor atoms to operate the donor atoms as qubits; wherein at least two pairs of nearest neighbour donor atoms of the plurality of donor atoms are arranged along the [110] direction of the silicon crystal substrate and are configured to operate as qubits.

In some embodiments, each pair of nearest neighbour donor atoms has an exchange coupling value, and the maximum variation in the exchange coupling values between pairs of donor atoms is less than a predetermined factor.

In some embodiments, the predetermined factor is 10.

Furthermore, the silicon crystal substrate may include a plurality of donor sites arranged along the [110] direction, each site including a plurality of positions and where a first donor atom is located at a first position of the plurality of positions at a first donor site and a second donor atom is location at a second position of the plurality of positions of a second donor site, and wherein the first position is different from the second position.

In certain embodiments, each donor sites includes six positions.

Further, when the first donor atom is located at any position of the plurality of positions at the first donor site and the second donor atom is location at any position of the plurality of positions at the second donor site, a two-dimensional protection is provided to the exchange coupling J against valley interference.

Furthermore, the distance between donor atoms in a pair of donor atoms may be at least 10 nm and in some embodiments is between 10 nm and 25 nm.

The quantum processing system may further include a plurality of control gates arranged about the donor atoms to create detuning fields to increase the exchange coupling value between at least 90% of the pairs of donor atoms to a particular exchange coupling value.

According to a second aspect of the present disclosure, there is provided a quantum processing system comprising: a plurality of donor atoms positioned at donor sites in a silicon crystal substrate; a plurality of conductive control electrodes arranged about the donor atoms to operate the donor atoms as qubits; wherein at least one pair of nearest neighbour donor atoms is arranged along the direction of the silicon crystal substrate in one of a plurality of possible non-equivalent donor-donor positions with respect to each other, wherein each non-equivalent donor-donor position is associated with an exchange coupling value and the variations in the exchange coupling values in respect of the plurality of possible non-equivalent donor-donor positions is less than a predetermined factor.

The plurality of non-equivalent donor-donor positions may include 10 configurations.

Further, a two-dimensional protection is provided to the exchange coupling J against valley interference when the at least one pair of nearest neighbour donor atoms are arranged in any one of the plurality of possible non-equivalent donor-donor positions.

According to a third aspect of the present disclosure, there is provided a quantum processing system comprising: a plurality of qubits created by positioning donor atoms in a silicon crystal substrate along the [110] direction such that the difference in the magnitude of exchange coupling between pairs of donor atoms is less than a predetermined factor; and a plurality of control gates arranged about the donor atoms to create detuning fields to increase the exchange coupling value between at least 90% of the pairs of donor atoms to a particular exchange coupling value.

In certain embodiments, a pair of control gates of the plurality of control gates is arranged to control a pair of qubits to create a detuning electric field.

Further still, the quantum processing system of the third aspect may include a plurality of conductive control electrodes arranged about the donor atoms to operate the donor atoms as qubits.

According to a fourth aspect of the present disclosure, there is provided a structure for use in a quantum processing system, the structure comprising: a silicon crystal substrate comprising a plurality of donor atom sites arranged along the [110] direction of the silicon crystal substrate, each donor atom site comprising a plurality of possible positions for positioning a donor atom; a plurality of donor atoms, each donor atom positioned in a corresponding donor atom site of the plurality of donor atom sites in any one of the plurality of possible positions; wherein donor atoms nearest to each other in the [110] direction interact with each other and each pair of nearest neighbour donor atoms has an exchange coupling value, and wherein the maximum variation in the exchange coupling values between multiple pairs of nearest neighbour donor atoms is less than a predetermined factor.

BRIEF DESCRIPTION OF DRAWINGS

FIG. 1A is a schematic representation of a unit cell of the bulk silicon crystal in real space.

FIGS. 1B-1D illustrate the different planes and directions in a silicon unit cell lattice. In particular, FIG. 1B shows the [100] direction and plane, FIG. 1C shows the direction and plane, and FIG. 1C shows the [111] direction and plane.

Figure 1D:
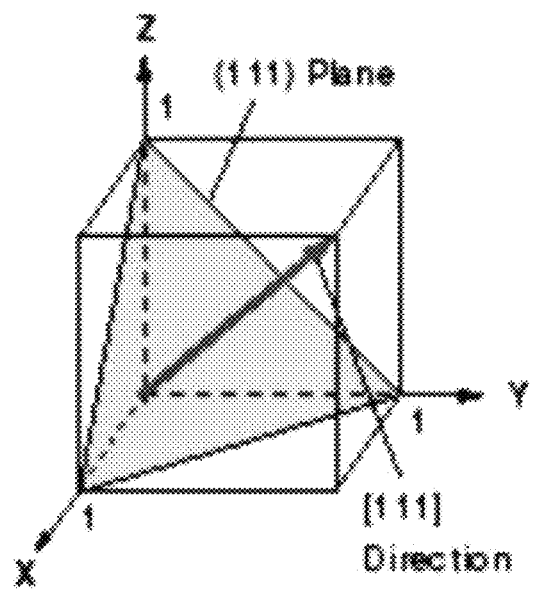

While the invention is amenable to various modifications and alternative forms, specific embodiments are shown by way of example in the drawings and are described in detail. It should be understood, however, that the drawings and detailed description are not intended to limit the invention to the particular form disclosed. The intention is to cover all modifications, equivalents, and alternatives falling within the spirit and scope of the present invention as defined by the appended claims.

DETAILED DESCRIPTION

Overview

This section describes known properties of silicon and the issues associated with placing donor atoms in silicon substrates to fabricate advanced processing systems, such as quantum processing systems.

Silicon has a crystalline structure with cubic symmetry. Each silicon crystal is characterised by a unit cell which repeats in the x, y, and z directions. FIG. 1A illustrates one unit cell 100 of silicon, which includes eight silicon atoms at the eight corners of the cubic structure. The Miller index is generally used to describe the lattice planes and directions of the silicon unit cell 100. According to this index, a direction is defined using the x, y, and z directions. For example, the direction [110] defines a vector direction normal to the surface of an xy plane or facet. Three main crystal directions are defined using this index—the [100] direction, [110] direction, and [111] direction as illustrated in FIGS. 1B, 1C, and 1D.

Figure 2:
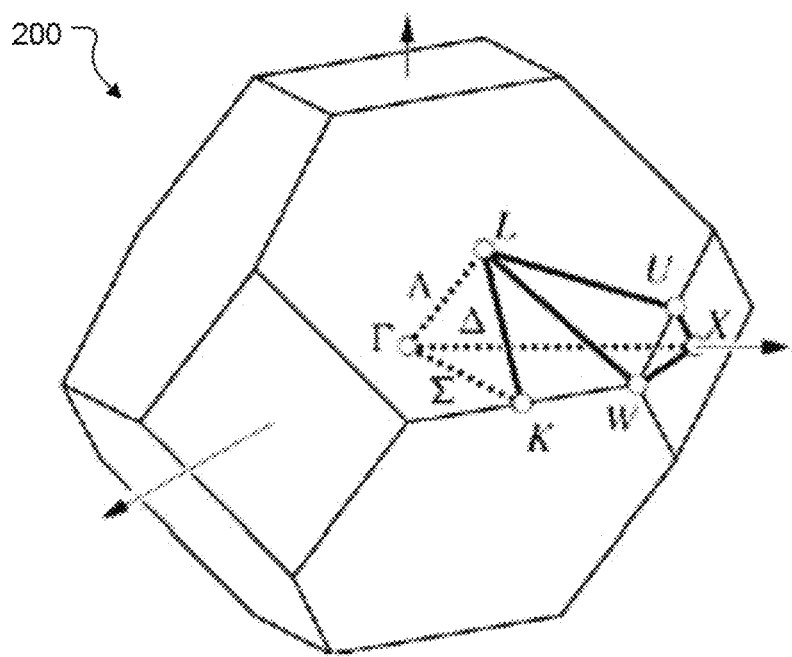
FIG. 2 is a schematic representation of the silicon crystal of FIG. 1A in reciprocal space.

Further, it will be appreciated that the band structure of silicon is complex. It has the property that the energies of electron states in the conduction band are not minimized when the crystal momentum (k) is zero, but rather minimized at a non-zero value, $k_\mu$, that is about 81% of the way to the Brillouin zone boundary as shown in the reciprocal lattice cell 200 for Silicon with first Brillouin zone in FIG. 2.

As silicon has cubic symmetry and there are six equivalent minima in the structure, silicon is commonly said to have six degenerate valleys in its conduction band. In conventional electronic devices, the presence of multiple valleys typically does not affect transport properties in a profound way. However valley physics plays a critical role in quantum electronics because interference between different valleys complicates spin manipulation of donor atoms placed in silicon substrates.

Figure 3:
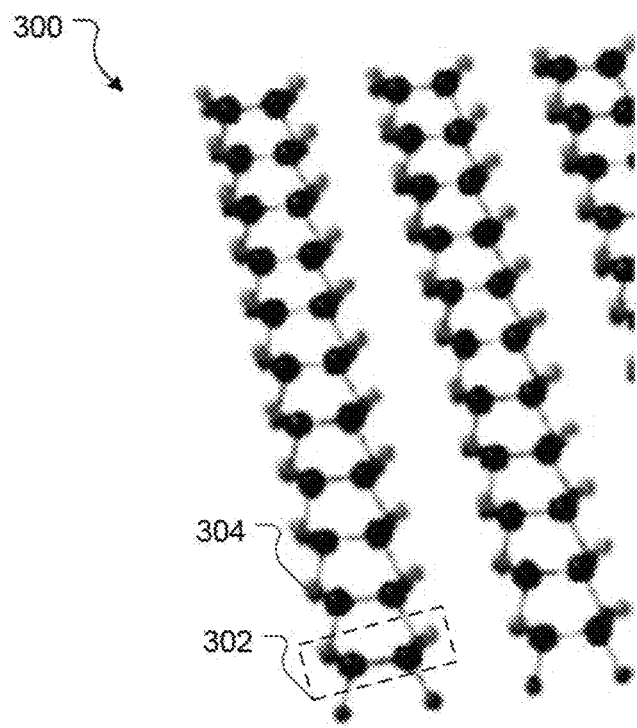
FIG. 3 is a schematic representation of a 2×1 silicon surface with rows of silicon dimers.

Generally speaking, each silicon atom in the lattice structure 100 is bonded to four other silicon atoms—two below and two above. This is the most stable state for silicon since all of its possible bonds are fulfilled. The silicon atoms on the surface of the substrate, however, only bond with the two silicon atoms below as they lack any atoms above to bond with. Surface Si atoms therefore have two available bonding sites above (known as dangling bonds). To reduce the number of dangling bonds, pairs of adjacent silicon atoms on the surface bond with each other, leaving each surface silicon atom with one available dangling bond. When pairs of adjacent surface silicon atoms bond with each other in this way, they are pulled towards each other and out of their cubic lattice positions, forming rows of silicon atom pairs known as dimer rows. FIG. 3 illustrates a 2×1 silicon surface 300 with rows of dimers 302. The figure also illustrates the dangling bond 304 on each silicon atom.

As mentioned previously, some quantum processing systems are fabricated by placing donor atoms (such as phosphorus atoms) in $^{28}$Si structures. This fabrication typically involves exposing the silicon surface to atomic hydrogen such that hydrogen atoms can bond to surface Si atoms (using the dangling bonds 304), forming a monolayer of hydrogen atoms on the surface. Thereafter, a scanning tunnelling microscope (STM) tip is used to selectively desorb hydrogen atoms exposing dangling bonds in precise selected locations (e.g., 6 hydrogen atoms may be desorbed in a particular location to expose 3 silicon dimers). Phosphorus donor atoms are then introduced e.g., by way of phosphine gas ($PH_3$), such that exactly one phosphorus atom strongly bonds with an exposed dangling bond at each exposed location (e.g., a phosphorus donor atom may strongly bond with any one of the three silicon dimers in a particular location). Thereafter, pairs of phosphorus electrons bound to donor atoms embedded in the silicon crystal can interact (via exchange coupling, J) with each other to form qubit pairs that may be controlled to perform certain circuit operations.

Figure 4A:
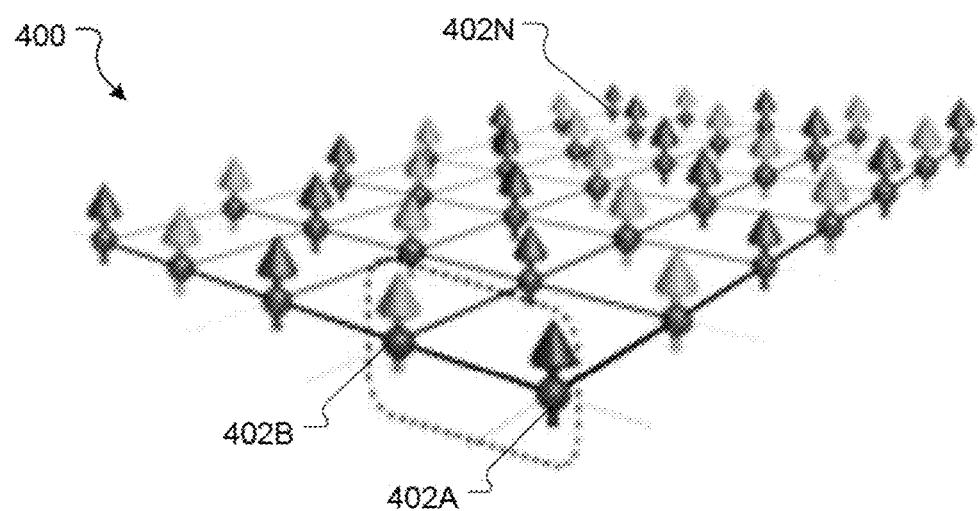
FIG. 4A is a schematic of a 2D array of single electron spins bound to donor atoms in a silicon substrate.
Figure 4B:
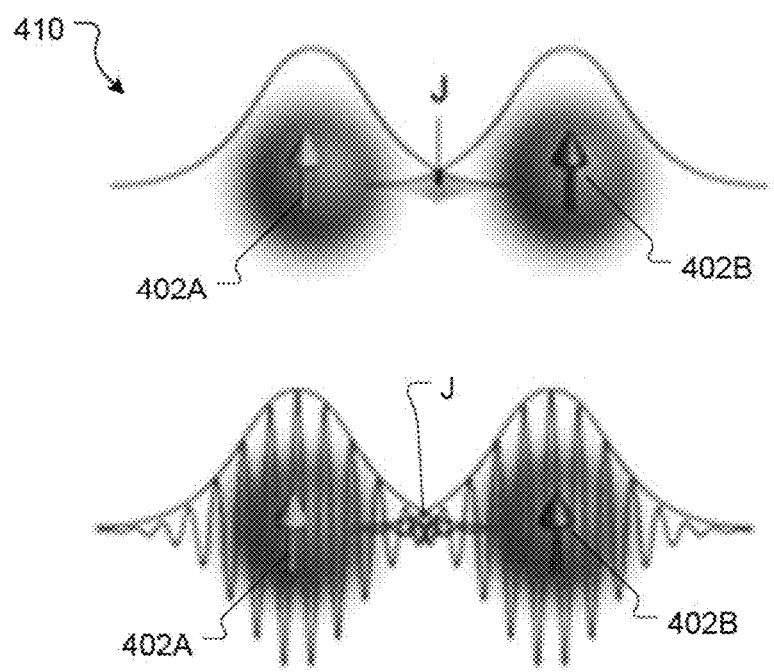
FIG. 4B is a diagram illustrating the exchange interaction between two donor atoms.

FIG. 4A is a schematic of a 2D array 400 of single electron spins bound to donor atoms 402A, 402B, . . . , 402N, in $^{28}$Si, where 2-qubit operations occur between nearest neighbours (e.g., donor atoms 402A and 402B) using the Heisenberg exchange interaction. FIG. 4B illustrates the exchange interaction 410 between the two donor atoms 402A and 402B of FIG. 4A.

One important feature for exchange coupling between donor atoms is the oscillation of the exchange coupling with donor separation changing over the order of a lattice constant, due to the multi-valley silicon conduction band mentioned previously. The interference between these valleys can cause fast oscillations in the exchange interaction and could lead to exchange gate errors and a desynchronised quantum processor. Another issue with donor-based qubits is the randomness or uncertainty in donor placement precision, which happens because a donor atom may bond with any of the three exposed silicon dimers at a particular site depending on how the $PH_3$ molecule positions itself during CVD within the exposed dimer array. These two features lead to an inherent randomness in the resulting exchange coupling J between two qubits, which in turn leads to exchange gate errors and a desynchronised quantum processor.

Over the last decade, many researchers have studied the effects of these features on the exchange coupling between adjacent donor atoms and have found that in a one dimensional position scheme, exchange coupling between two adjacent donor atoms is immune to valley interference along the [100] crystallographic direction. However, this assumes that donor atoms can be positioned accurately and in a perfectly linear arrangement. This is incompatible with state-of-the-art dopant positioning using STM lithography, where dopants are randomly incorporated within a patch of 3 dimers, resulting in two dimensional uncertainty in the relative positions of adjacent donor atoms. Some studies considered the random 3D donor placement errors and have also concluded that there is no region in space, including along [100], where valley-induced exchange variations are limited and the exchange is stabilized.

Based on these studies, when fabricating donor based qubits, researchers have typically positioned phosphorus donors in the silicon surface along the [100] direction.

However, contrary to common knowledge and practice, the present inventors have found a dopant placement scheme where the exchange is immune to in-plane valley interference, hence to the in-plane (2D) stochastic variations in the dopant positions.

In particular, inventors of the present application have proposed donor-based quantum processing systems with donor atoms located at donor sites arranged in the [110] direction. Such quantum processing systems take into account realistic donor positioning errors or variations and exhibit exchange variations of less than a factor of 10. Because of this, the proposed donor-based quantum processing systems achieve exchange uniformity, whilst preserving bulk reproducible donors properties.

The donor atoms in the presently disclosed quantum processing systems are arranged based on customised exchange calculations and analysis tied to the actual locations of the donor atoms in a silicon plane, which is achievable using STM technology.

The following sections describe the experimental results, a silicon substrate with donor atoms placed in the plane, the process for fabricating donor based qubits in the [001] plane and a quantum processing system using donor based qubits in the [001] plane.

Experimental Results

The presence of valley-induced J-oscillations inevitably constrains the design of a quantum architecture. First, a direct consequence of the exchange exponential decay due to the envelope part shown in FIG. 4B is the requirement to place donor atoms within about 2 nm accuracy, i.e., the electron Bohr radius, failing which the exchange coupling J varies by more than an order of magnitude. This threshold is critical as it is often difficult to tune exchange coupling variations of this or any greater order of magnitude by any known tuning scheme, which ultimately affects qubit uniformity in a particular quantum processing system and thus the ability to control and address such qubits in synchronized operations, that may be required in large-scale quantum processing.

STM lithography techniques generally fulfil this requirement, as it is possible to stochastically incorporate a single donor atom within a patch of 3 hydrogen desorbed dimers along the [110] direction using STM. However, even with STM, it is difficult to predict or force the donor atom to bond with a particular silicon atom of the 6 exposed silicon atoms and in reality the donor atom stochastically bonds with any of the six exposed silicon atoms, given the chemical reaction occurring between the dangling bonds and the $PH_3$ molecule. Because of this, there may be up to 12 non-equivalent donor-donor positions of two adjacent donor atoms.

Figure 5A:
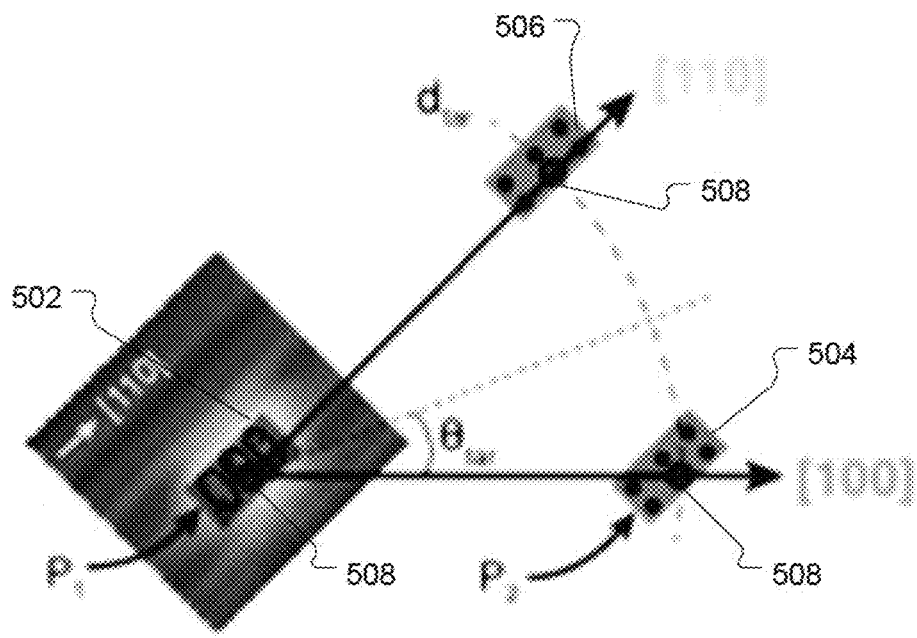
FIG. 5A is a schematic representation of a donor atom sites in the [100] direction and the [110] direction in relation to a particular donor atom site.

FIG. 5A illustrates a donor atom site 502 and two other donor atom sites 504 and 506, where the donor atom site 504 is in the [100] direction from the donor atom site 502 and the donor site 506 is in the [110] direction from the donor atom site 502. Furthermore, each donor site 502, 504 and 506 includes 6 possible positions where a donor atom 508 may be placed. In FIG. 5A, the donor atoms 508 in sites 502, 504 and 506 are bonded to a silicon atom in the intermediate silicon dimer for a target distance $d_{tar}$ and target angle $\theta_{tar}$. The open circles in FIG. 5A indicate the target positions in both directions.

Figure 5B:
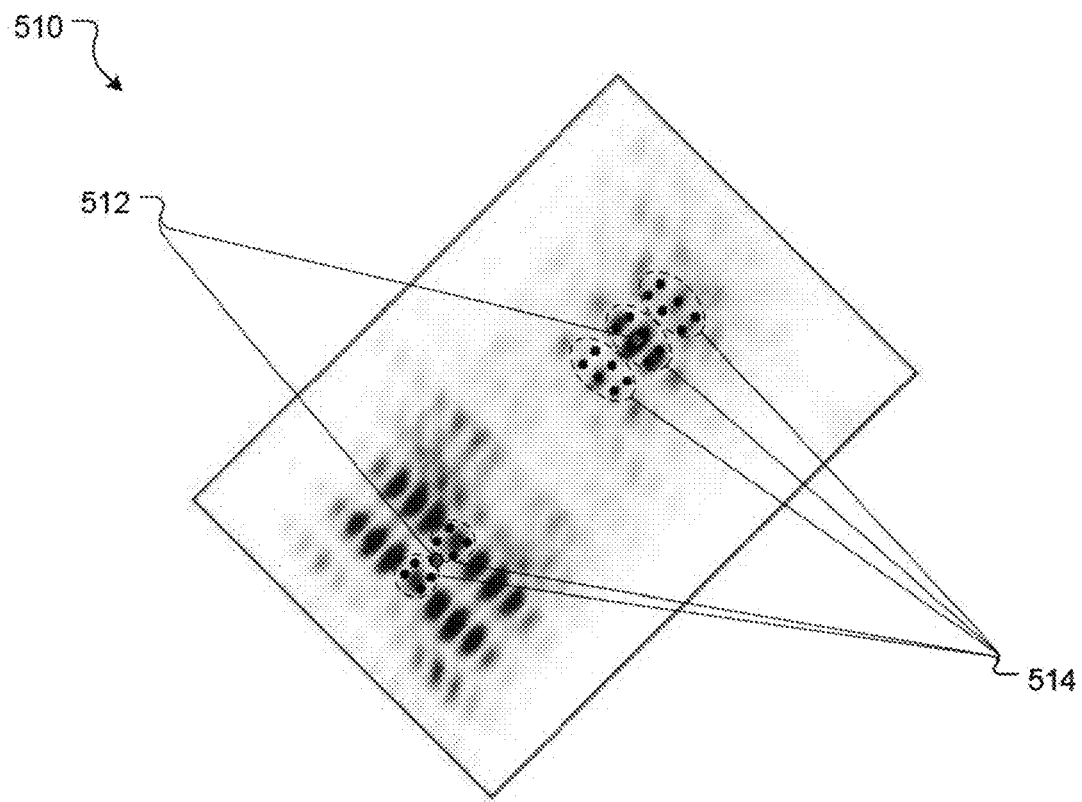
FIG. 5B is an STM image of the quasi-particle wave function of an exchange-coupled donor pair.
Figure 5C:
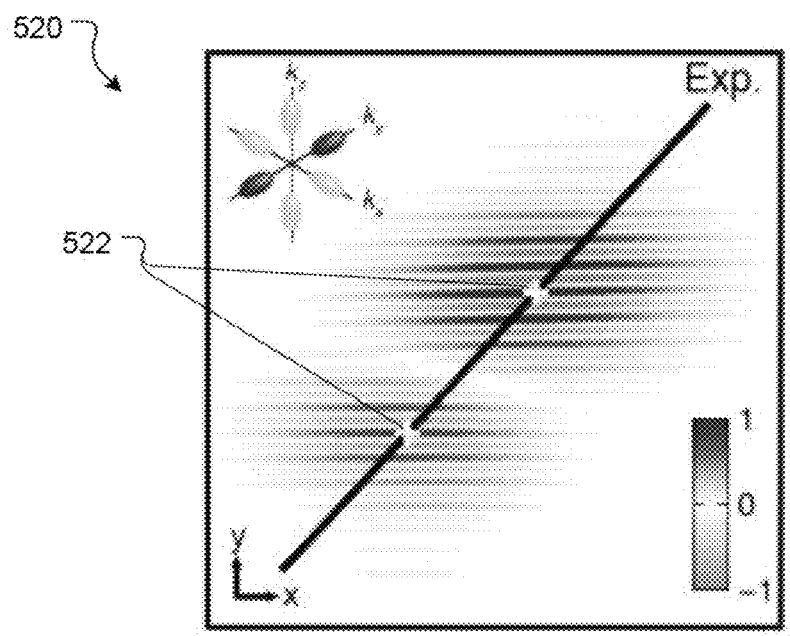
FIG. 5C depicts the STM image of FIG. 5B filtered around the valley frequency $k_\mu \sim 0.81 * k_0$ showing the in-plane y-valley interference.
Figure 5D:
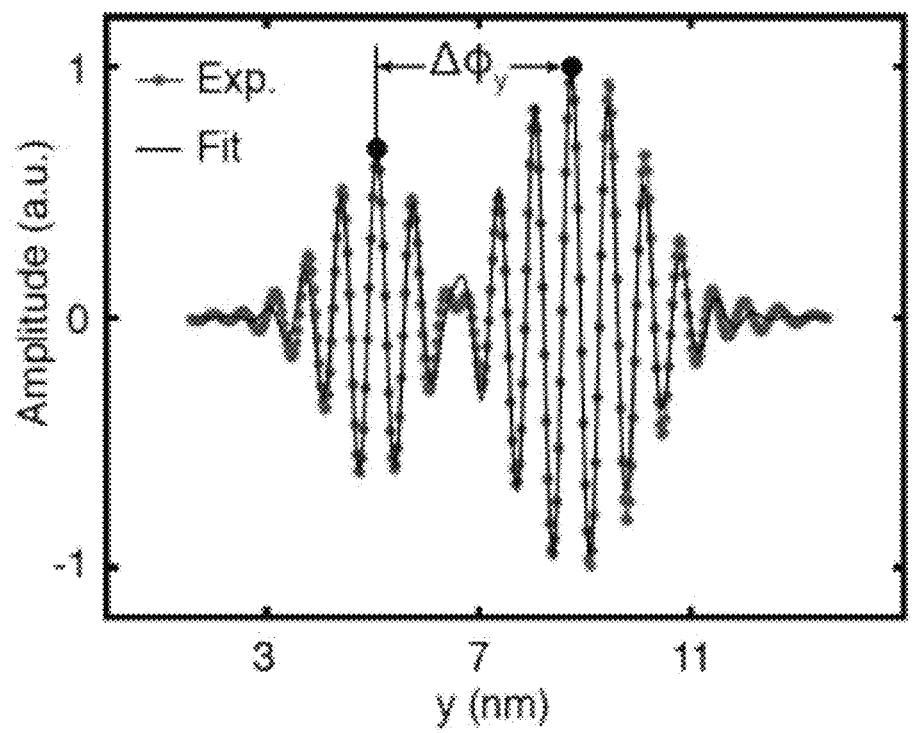
FIG. 5D is a plot of the phase difference $\Delta \varphi y$ extracted from a fit of a line cut through the two donor atoms shown in FIG. 5C

The Inventors performed low-temperature STM on exchange-coupled donors to directly image and measure, at the wave-function level, valley phase interference between the two donor atoms. This is done by filtering the STM image around the valley frequency $k_\mu \sim 0.81*k_0$ so that the valley phase differences $\Delta\phi\mu$ between the two donors can be extracted. FIGS. 5B-5D illustrate the y-valley interference and valley phase difference for one donor-donor position of adjacent donor atoms.

In particular, FIG. 5B is an STM image of the quasi-particle wave function of an exchange-coupled donor pair 510. The dots 512 represent the pinpointed positions of the two donors, the dots 514 represent the silicon atom positions at the 2×1 reconstructed surface. FIG. 5C shows the STM image 510 of FIG. 5B filtered around the valley frequency $k_\mu \sim 0.81*k_0$ showing the in-plane y-valley interference. The crosses 522 indicate the position of the donor positions. FIG. 5D is a plot of the phase difference $\Delta\phi y$ extracted from a fit of a line cut through the two donor atoms shown in FIG. 5C. If $\Delta\phi y$ is close to $\pi$, the y-valleys interfere destructively between the two donors, which can impact the exchange coupling J.

From these images, the valley phase interference between donors was directly quantified. This is the first time that valley interference between two phosphorus atoms in silicon have been directly observed and quantified. From these observations, the Inventors have constructed a predictive model for the magnitude of the exchange variations, using only experimentally measured parameters as inputs. This model is a phenomenological effective mass model (P-EM) and it can be represented as—

$$J(\vec{R}) = \Sigma_{\mu\nu} j_{\mu\nu}(\vec{R}, a, b) \cos(\Delta\phi_\mu \pm \Delta\phi_\nu) \quad (1)$$

where $\Delta\phi_\mu$ is the valley phase differences between neighbouring donors in valley $\mu$, $\Delta\phi_\nu$ is the valley phase difference between neighbouring donors in valley $\nu$, a and b are the anisotropic envelope Bohr radii, $\vec{R}$ is the relative position between the two donors, $\mu$ denotes the valley in which the first electron is exchanged between the two donors and $\nu$ denotes the valley in which the second electron is exchanged between the two donors.

In this equation, the first part (i.e., $j_{\mu\nu}(\vec{R}, a, b)$) includes envelope or orbital terms and this part affects the exchange value (J) in a smooth, slow varying fashion. The second part (i.e., $\cos(\Delta\phi_\mu \pm \Delta\phi_\nu)$) includes valley interference terms, which affect the exchange value (J) in a fast varying manner.

Figure 5E:
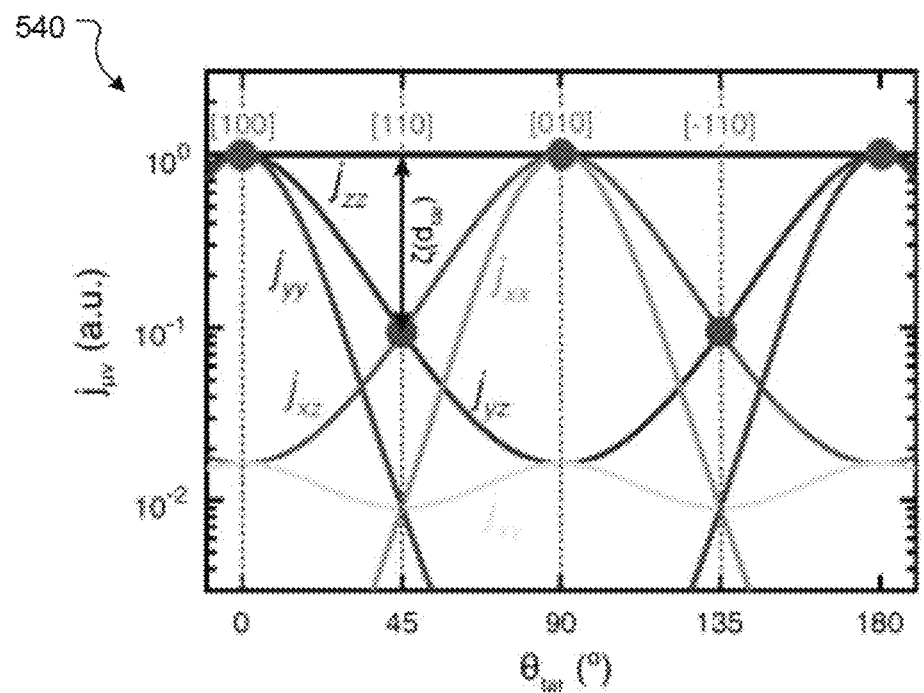
FIG. 5E is a plot illustrating normalized envelope weights jµv plotted against $\theta_{tar}$ for $d_{tar}$=12 nm.

FIG. 5E is a plot 540 illustrating normalized envelope weights $j_{\mu\nu}$ plotted against $\theta_{tar}$ for $d_{tar}=12$ nm. As seen in this plot, the relative weights of the 6 different envelope terms ($j_{xx}, j_{xy}, j_{xz}, j_{yy}, j_{yz}$, and $j_{zz}$) evolve smoothly since they do not contain any valley interference, but their ratios are not constant and vary by several orders of magnitudes. This is a direct consequence of the anisotropic and exponential nature of the donor envelope. As seen in the plot 540, along the [100] direction, the $j_{yz}$ terms are degenerate with $j_{zz}$ and $j_{yy}$, and largely dominate over any term where an electron is exchanged in the x-valley. The degeneracy between $j_{yz}, j_{zz}$, and $j_{yy}$ arises from symmetry as the products between y and z orbitals are equal along the [100] direction.

Along the [110] direction, however, the prevalence of $j_{zz}$ is maximised. Therefore, in this direction, $j_{zz}$ dominates over the degenerate terms $j_{xz}$ and $j_{yz}$. Accordingly, placing donors along the [110] direction results in finite $\Delta\phi_x$ or $\Delta\phi_y$, which can vary according to the configuration specifically obtained from pair to pair, and hence to destructive $j_{xz}$ and $j_{yz}$ terms. However, they both have a negligible impact on the value of exchange since $j_{zz}$ dominates in this direction.

Figure 5F:
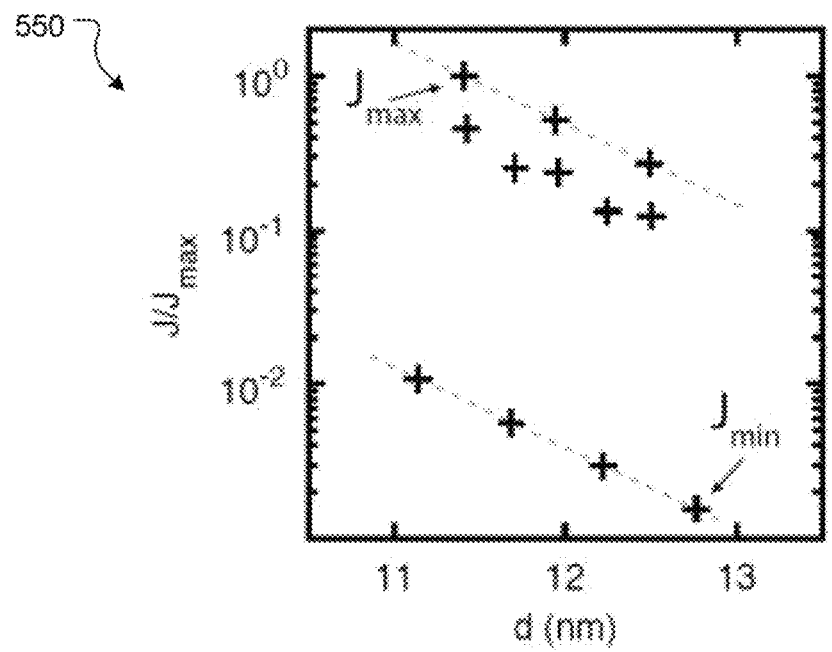
FIG. 5F is a plot illustrating the exchange interaction values for donor atoms positioned in the [100] direction.
Figure 5G:
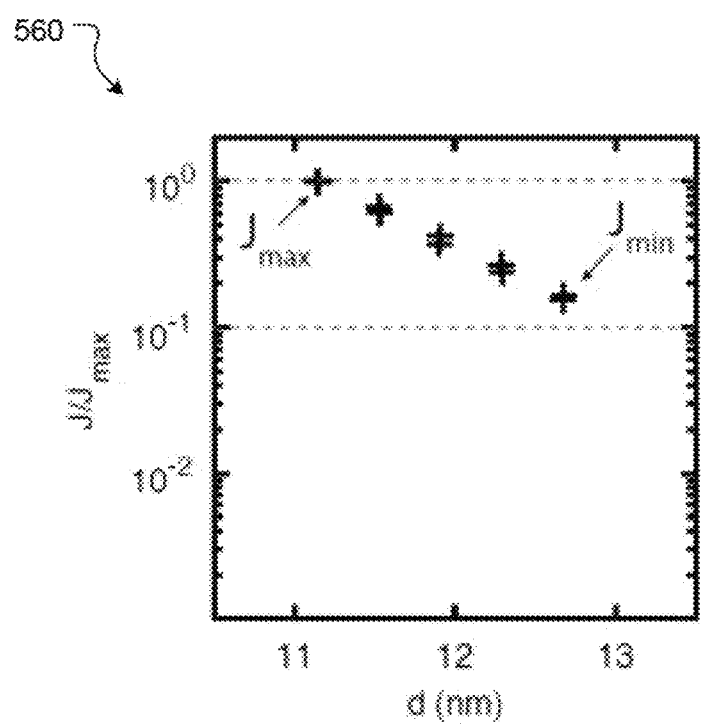
FIG. 5G is a plot illustrating the exchange interaction values for donor atoms positions in the [110] direction.

FIG. 5F is a plot 550 illustrating the resulting normalised J values for the 12 possible distances between two donor atoms that can each be placed in one of 6 possible positions in a donor site, computed for the [100] direction, i.e., where $\theta_{tar}=0°$ and FIG. 5G is a plot 560 illustrating the resulting normalised J values for the 10 possible distances between two donor atoms that can each be placed in one of 6 possible positions in a donor site, computed for the [110] direction, i.e., where $\theta_{tar}=45°$. The average distance between the donor atoms in both these cases is 12 nm (i.e., $d_{tar}=12$ nm). Each of these plots illustrates the normalized J values calculated based on the phenomenological effective mass (P-EM) theory model of equation (1).

As seen in FIG. 5F, the variation in the normalized J values for each of the 12 different positions in the [100] direction is approximately a factor of 100, or two orders of magnitude, for variations in distance arising from the different positions from 11 nm to 13 nm. For example, the difference between the lowest exchange coupling value (Jmin) and the highest exchange coupling value (Jmax) is greater than a factor of 100. This variance in normalized J values can be explained by the plot 540 and the P-EM model. The degeneracy and dominance of the $j_{yy}, j_{zz}$ and $j_{yz}$ terms along the [100] direction implies that the sum expressed in Eq. 1 can be reduced to these terms, which only involves $\Delta\phi_y$ and $\Delta\phi_z$, the latter being zero in the xy-plane. Hence, only $\Delta\phi_y$ matters along the [100] direction. The normalized J values for positions that are perfectly aligned in the [100] direction lead to constructive y-valleys, i.e., $\Delta\phi_y=0$ and a maximized J value. However, when the donor atoms are misaligned or not perfectly aligned along the [100] direction, the $\Delta\phi_x$ is a finite value and hence the normalized J values for this configuration is reduced by more than two orders of magnitude for these positions. This means that only the x-valley interference (i.e. $\Delta\phi x$) does not impact the exchange when placing donors along the [100]

direction, offering a one dimensional protection to the exchange against valley interference from dopant placement errors.

On the other hand, as seen in FIG. 5G, the variation in the normalized J values for each of the 10 different positions in the [110] direction for variations in distance arising from the different positions from 11 nm to 13 nm is less than a factor of 10. For example, the difference between the lowest exchange coupling value ($J_{min}$) and the highest exchange coupling value ($J_{max}$) is a factor of less than 10. This can again be explained by the plot 540 and the P-EM model of equation (1). Placing donors along the [110] direction results in finite $\Delta\phi_x$ or $\Delta\phi_y$, which can vary according to the positional differences between the pair of donor atoms. However, both these values have a negligible impact on the J value as $j_{zz}$ dominates in the [110] direction. As a result, the possible exchange values (J) obtained for two donors along the [110] axis are much more constrained and vary by less than an order of magnitude as shown in plot 560. The fact that neither $\Delta\phi x$ or $\Delta\phi y$ impact the exchange when placing donors along the [110] direction offers a two-dimensional protection to the exchange coupling J against valley interference from dopant placement errors, which donor placement in the [100] direction cannot offer.

Figure 5H:
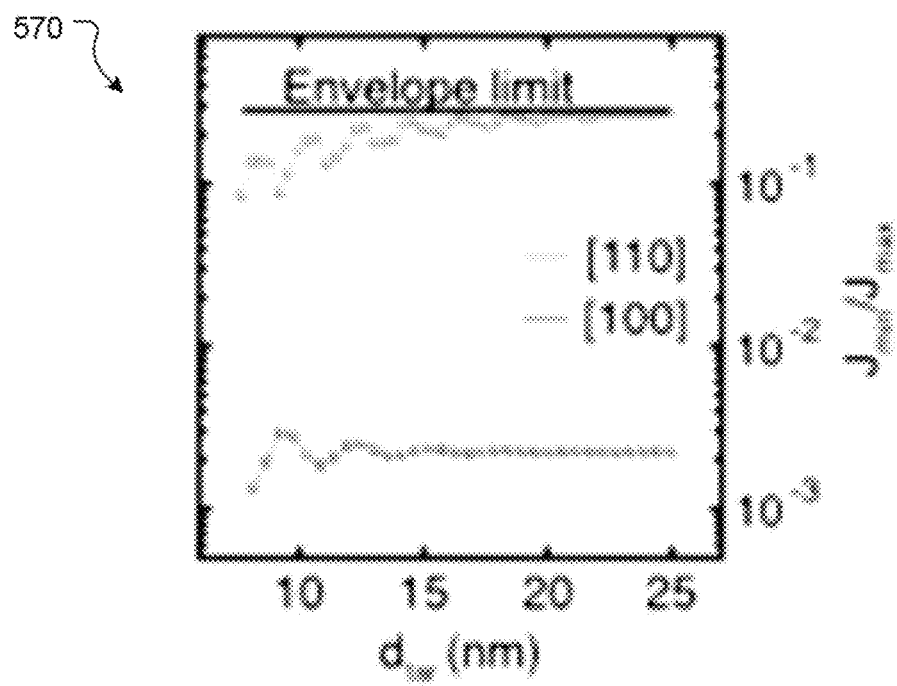
FIG. 5H is a plot illustrating ratios of the minimum and maximum exchange interaction values in the [100] and [110] directions for various inter-donor distances.

FIG. 5H is a plot 570 showing ratios of Jmin/Jmax values plotted for targeted positions in the [100] direction and [110] direction for a wide range of target distances from 10 nm to 25 nm between adjacent donor atoms. As shown in this figure, values in the [110] direction show limited variations (a factor of 10 or less) for a wide range of distances, approaching the envelope limit at target distances beyond 12 nm as the in plane valley interferences $\Delta\phi_x$ and $\Delta\phi_y$ do not impact the exchange value. In contrast, the values in the [100] direction remain well below a factor of 500 across the entire range as the degeneracy between $j_{yy}$, $j_yz$, and $j_{zz}$ remains for all distances.

Accordingly, it is clear that the variations in exchange coupling values around the [110] direction are consistently much lower (by at least an order of magnitude) than those around the [100] direction, and confined within a factor of 10 for a wide range of distances offering a large range of available exchange values for quantum computing purposes.

The demonstration that the [110] direction is optimal and can minimise valley-induced exchange variations, facilitates the building of robust and consistently performing 2-Qubit gates and unveils crucial information for quantum computing architecture strategies, where for instance robust two-qubit operations need to be achieved.

Figure 6:
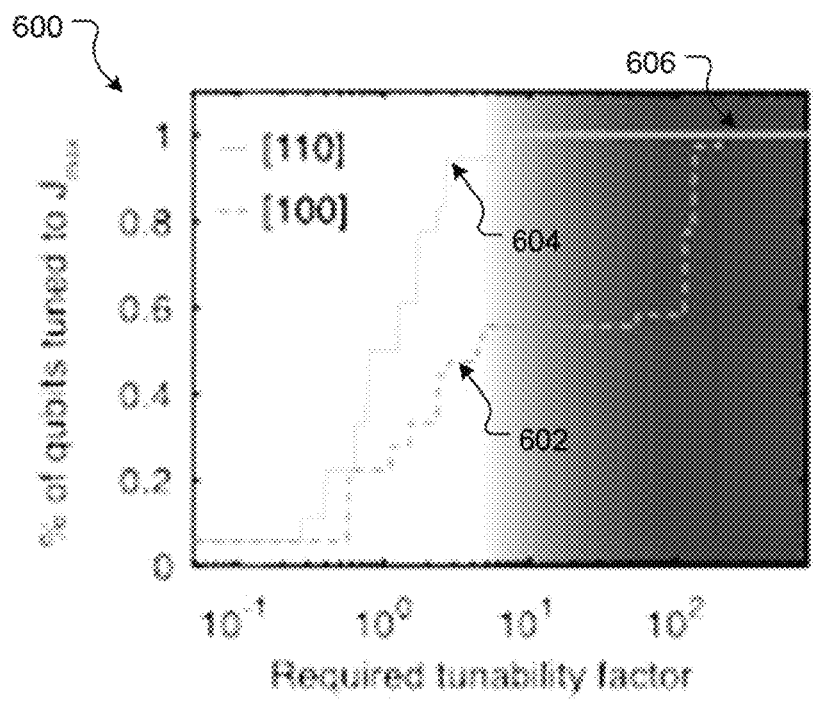
FIG. 6 is a plot illustrating the percentage of qubits tuned to a maximum exchange interaction value for a given tunability factor in the [100] and [110] directions.

Further still, FIG. 6 is a plot 600 showing the percentage of qubits tuned to the maximum value for a given tunability factor. For a realistic tunability factor of 3, consistent with proposed donor qubits tuning schemes for a distance of 15 nm and more, about 50% of the qubits would be tuned if the donors are aimed along [100], as is shown in broken outline at 602. However, this percentage goes beyond 90% along [110] for the same factor as is shown in solid outline at 604, reaching the minimum yield for a globally controlled stable quantum machine with efficient quantum error correction to be implemented. This percentage could be reached for donors in the [100] direction for a tunability factor of about 100, as is shown at 606, (which is not realistic).

Accordingly, the envelope-limited exchange variations along the [110] direction constitute a valuable asset for larger scale quantum computing as the small variations in J values means that at least 90% of qubits in the [110] direction can be expected to be tuned to the maximum exchange interaction value such that at least 90% of the qubits in a quantum processing system can exhibit consistency and can be uniformly controlled.

Donor Qubits in Silicon

Figure 7:
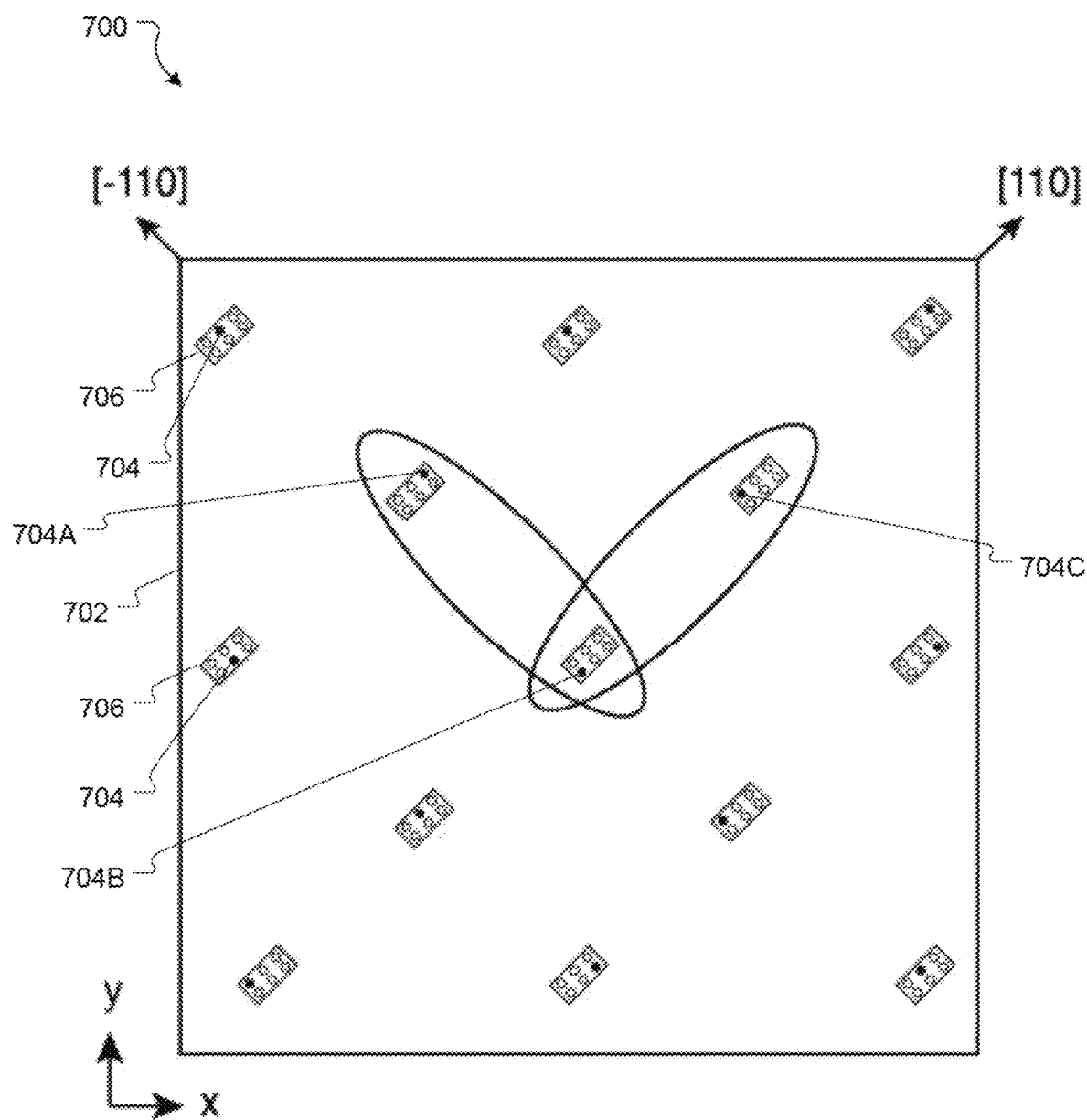
FIG. 7 is a schematic representation of an exemplary structure according to aspects of the present disclosure.

FIG. 7 illustrates an exemplary and highly schematic structure 700 for a quantum processing system according to aspects of the present disclosure.

The structure 700 includes a silicon crystal substrate 702 and a plurality of donor atoms 704 positioned in the silicon crystal substrate in the [001] plane. In particular, FIG. 7 illustrates the positioning of donor atoms in the same plane within donor atom sites 706 around either the [110] or [−110] directions (which are equivalent crystallographic directions). Each donor site 706 includes six possible positions where a donor atom 704 may be placed and as seen in FIG. 7, the donor atoms may occupy any of the possible six positions.

In structure 700, 2-qubit operations occur between nearest neighbour donor atoms (e.g., donor atoms 704A and 704B or donor atoms 704B and 704C) using the Heisenberg exchange interaction. The values of the exchange interaction between pairs of donor atoms 700 may be such that maximum variations in the exchange interaction values across the structure 700 are within a predetermined factor (e.g., a factor of 10).

Tuning Donor Qubits in Silicon in the [110] Direction (or Plane)

In certain embodiments, to further reduce variations in the exchange interaction values of the pairs of donor atoms shown in the FIG. 7, a tuning circuit may be employed to electrically tune the exchange coupling magnitude to a maximum exchange interaction value.

To achieve this, in some cases, a J-gate can be used between two donor atoms to tune the J-coupling to a particular value (e.g., $J_{max}$ shown in FIG. 5D). Alternatively, A-gates can be used.

Figure 8A:
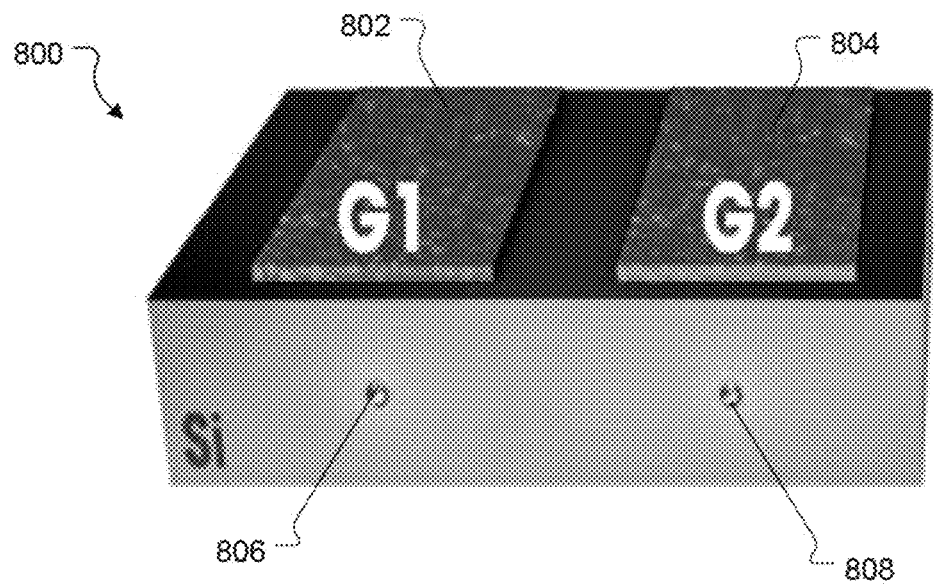
FIG. 8A illustrates a tunable 2-qubit gate with control gates placed on top of a silicon substrate.
Figure 8B:
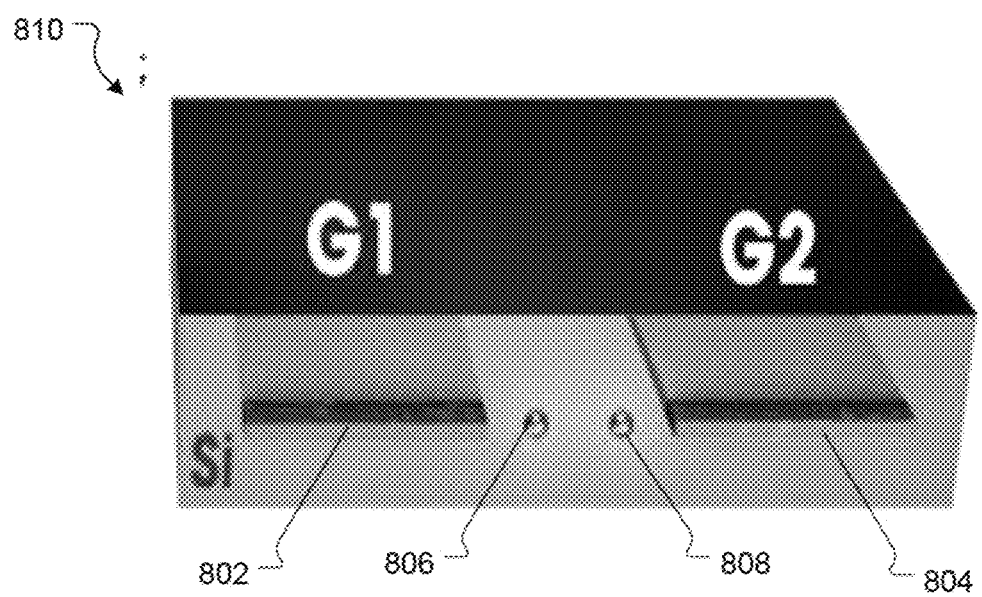
FIG. 8B illustrates a tunable 2-qubit gate with control gates placed in-plane with two qubits.

In still other embodiments, exchange gates may be utilized. FIG. 8 illustrates a tunable 2-qubit gate. In particular, FIG. 8A illustrates a tunable 2-qubit gate 800 with control gates 802 and 804 placed on top of a silicon substrate 805 with two qubits 806 and 808 and FIG. 8B illustrates a tunable 2-qubit gate 810 with control gates 802 and 804 placed in-plane (i.e., the [110 plane] with two qubits 806 and 808.

In operation, the control gates 802 and 804 create an electric field (called a detuning field) between the two qubits which enhances the exchange coupling between the qubits. In particular, the detuning field causes part of the charge from one qubit to transition to the other qubit. The charge configuration of the system is denoted as (M,N), where M indicates the number of electrons on the first donor atom, and N the number of electrons on the second donor atom. As the electron bound to one donor is pulled to the other by the detuning electric field, the exchange coupling J can be engineered from a smaller value in the (1,1) state to a larger value towards the (2,0) state due to the large spatial overlap of the wavefunctions in the latter. Such an electric field can be applied from either top gates (see, FIG. 8A) or from in-plane gates (see, FIG. 8B). Placed on either side of the donor qubits, the detuning gates eliminate the need for a sensitive tunnel barrier control by a J-gate. Further, this design relaxes the more stringent engineering requirements of donor separations and gate widths of the Kane architecture, leading to a reduced overall gate density in the quantum processing system.

As shown in FIG. 6 above, by tuning donor atoms that are at least 10 nm apart using a tuning factor of 5, at least 90% of the qubit pairs can be tuned to have substantially the same exchange interaction when they are positioned in the direction.

Fabricating Donor Qubits in Silicon in the [001] Plane

Figure 9A:
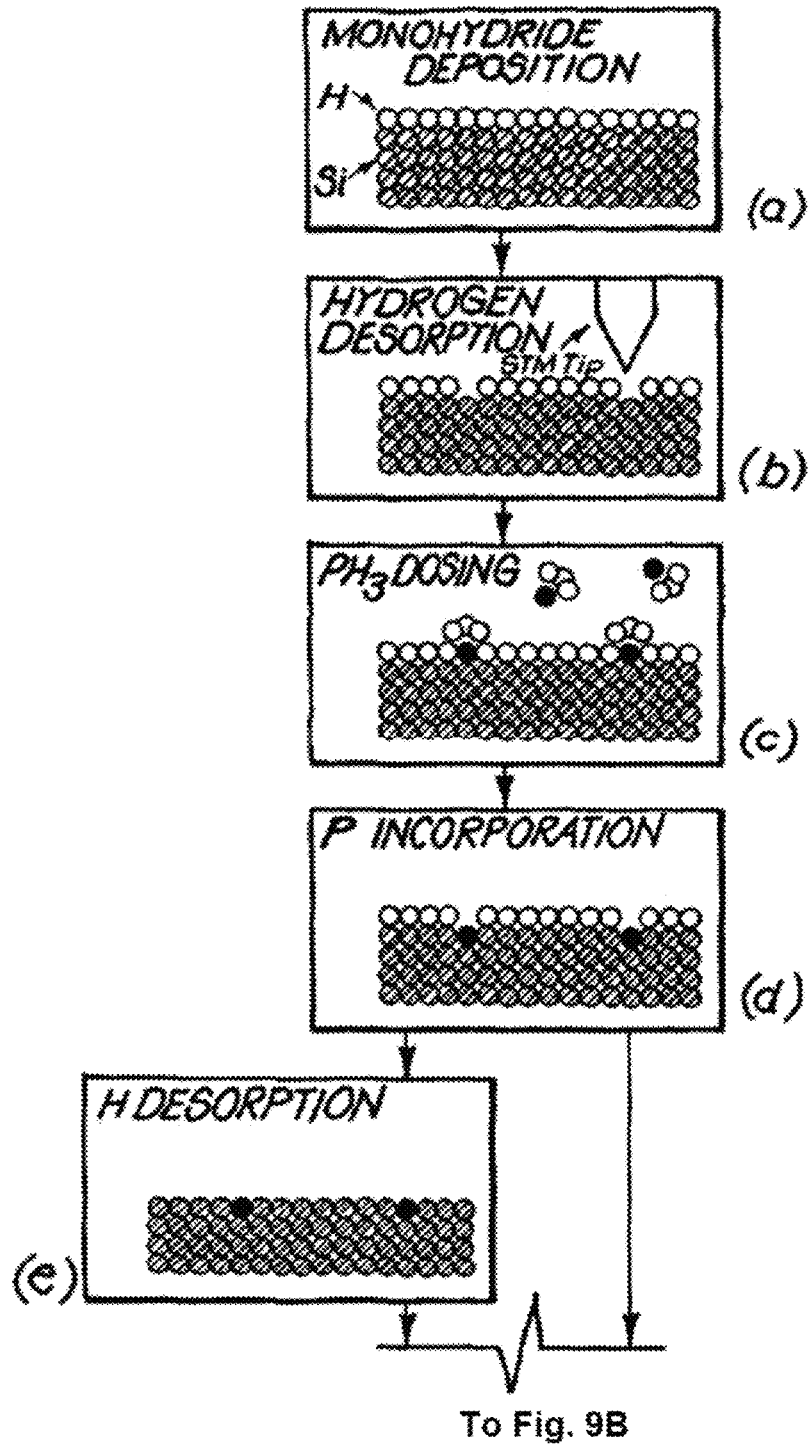
FIG. 9 is a schematic representation of the processing steps for placing donor atoms in a silicon substrate in the direction (or [001] plane) according to aspects of the present disclosure.
Figure 9B:
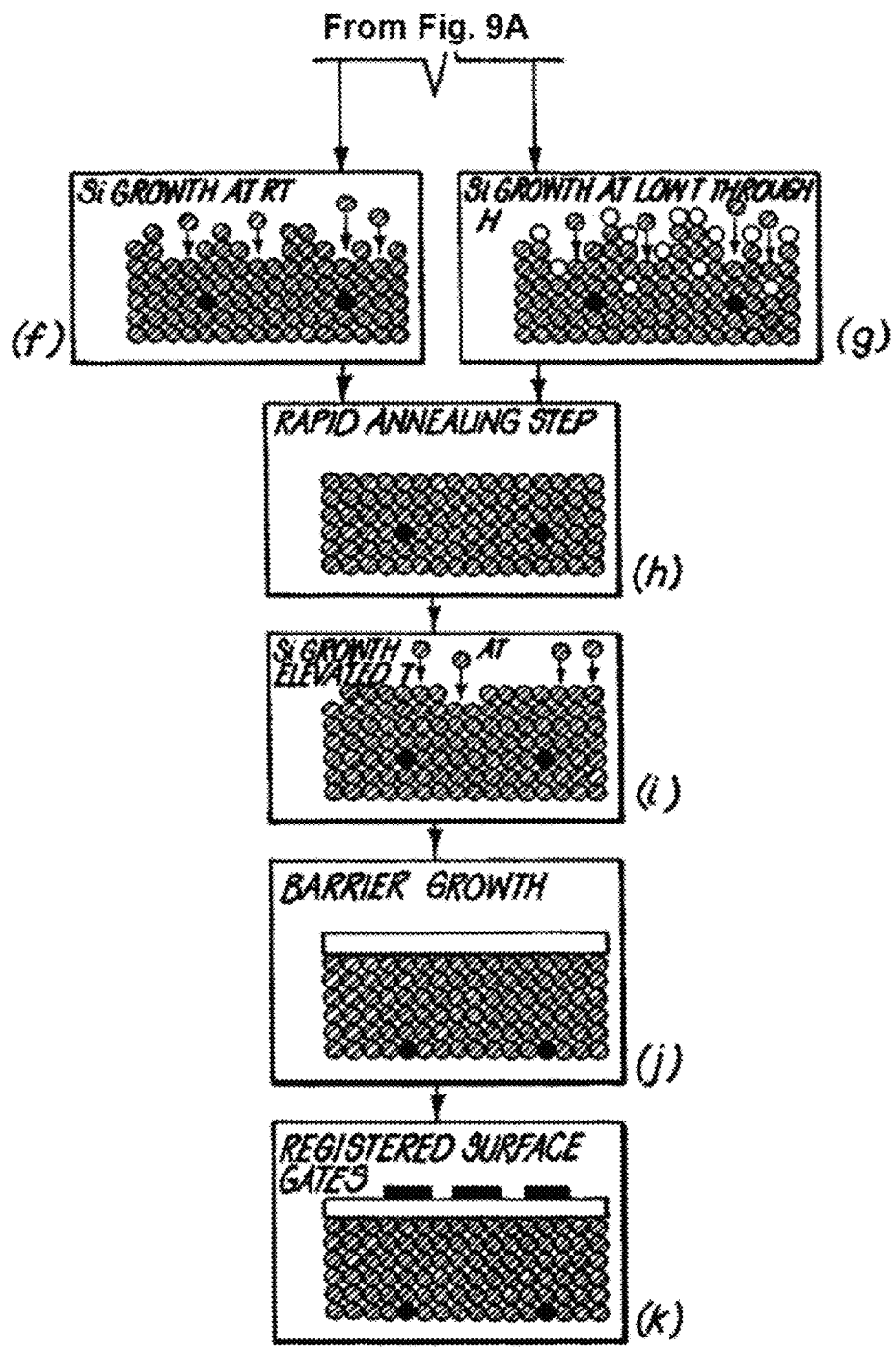

FIG. 9 outlines the individual processing steps (steps a-k) for placing donor atoms in a silicon substrate in the plane.

A clean Si 2×1 surface is formed in an ultra-high-vacuum (UHV) by heating to near the melting point. This surface has a 2×1 unit cell and consists of rows of σ-bonded Si dimers with the remaining dangling bond on each Si atom forming a weak π-bond with the other Si atom of the dimer of which it comprises.

Processing step (a) (i.e., monohydride deposition) involves exposing the clean Si 2×1 surface to atomic H to break the weak Si π-bonds, allowing H atoms to bond to the Si dangling bonds. Under controlled conditions a monolayer of H can be formed with one H atom bonded to each Si atom, satisfying the reactive dangling bonds, effectively passivating the surface; see step (a).

Next, at processing step (b) (i.e., hydrogen desorption), an STM tip is used to selectively desorb H atoms from the passivated surface by the application of appropriate voltages and tunnelling currents, forming a pattern in the H resist; see step (b).

It will be appreciated that H atoms are desorbed from precise locations where donor atoms are to be placed and according to aspects of the present disclosure, the H atoms are desorbed in such a manner as to create positions for donor atoms to be placed along the [110] direction.

Figure 10A:
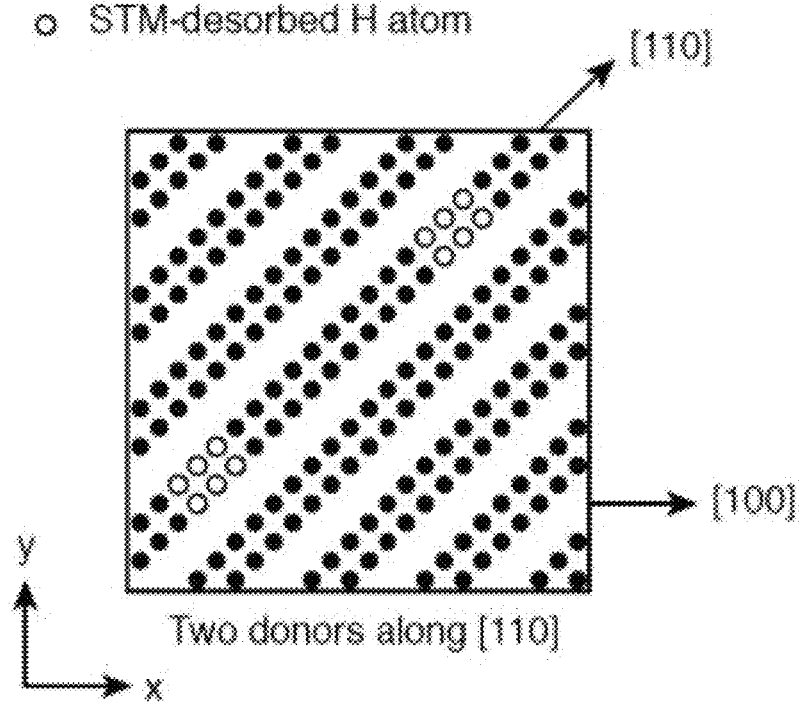
FIG. 10A is a schematic representation of H-desorption at two adjacent donor sites along the [110] direction.
Figure 10B:
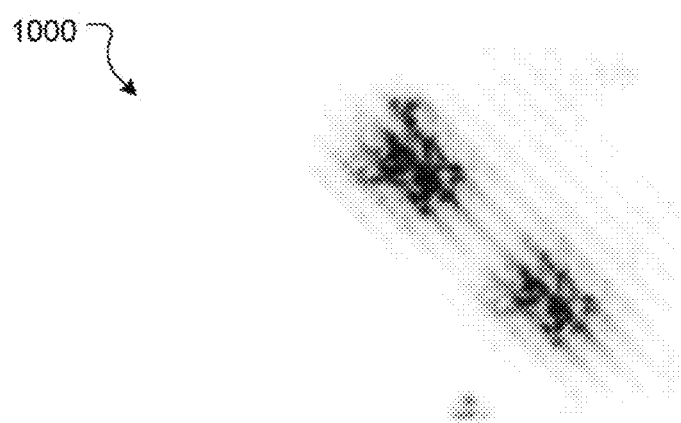
FIG. 10B is an image of two donor atoms positioned in a silicon substrate along the [110] direction.

A particularly advantageous characteristic of the dimer rows formed on the silicon substrate surface is that these rows are oriented in the [110] direction as seen in FIG. 9. Accordingly, to create positions for two nearest neighbour donor atoms in the [110] direction, the STM tip is used to desorb six hydrogen atoms at one location along a dimer row and then desorb six additional hydrogen atoms along the same dimer row at a particular distance (e.g., about 10-25 nm, and more preferably about 12-15 nm) from the first location (see FIG. 10B). This process is then repeated to create positions for other donor atoms along the [110] direction. In this way regions of bare, reactive Si atoms are exposed along dimer rows, allowing the subsequent adsorption of reactive species directly to the Si surface. FIG. 10B illustrates an image of two donor atoms positioned in a silicon substrate in the [110] direction using STM.

Returning to FIG. 9A, at step (c) (i.e., $PH_3$ dosing), phosphine ($PH_3$) gas is introduced into the vacuum system via a controlled leak valve connected to a specially designed phosphine micro-dosing system. The phosphine molecule bonds strongly to the exposed Si surface, through the holes in the hydrogen resist; see step (c). As noted previously, at a particular donor site, a phosphine molecule may bond with any one of the three exposed silicon dimers.

Subsequent heating of the STM patterned surface for crystal growth causes the dissociation of the phosphine molecules and results in the incorporation of P into the first layer of Si; see step (d). It is therefore the exposure of an STM patterned H passivated surface to $PH_3$ that is used to produce the required P array.

The hydrogen may then be desorbed, at step (e), before overgrowing the surface with silicon at room temperature, at step (f). An alternative is to grow the silicon directly through the hydrogen layer, as shown in step (g).

At step (h), the surface is rapidly annealed.

Silicon is then grown on the surface at elevated temperature, shown in step (i). A barrier is then grown as shown in step (j). Finally conductive gates may be aligned on the surface, as shown in step (k).

By fabricating the silicon substrate with donor atoms in this manner, i.e., arranged along the [110] direction, the values of exchange coupling can be managed such that error corrected quantum computing may be realised without using strained silicon. Accordingly, as compared to quantum processing systems where donor atom pairs are positioned along the [100] direction, the currently disclosed structures, architectures and processing systems are comparatively easier to fabricate.

U.S. Pat. No. 7,097,708, "Substituted donor atoms in silicon crystal for quantum computer," describes some aspects of a fabrication process that can be used to manufacture the device described herein and it is incorporated herein by reference in its entirety.

Quantum Processor Based on Donor Qubits in Silicon in the Direction

As described previously, a plurality of donor atoms are disposed in the [001] plane (or along the [110] direction) in a two dimensional matrix arrangement in silicon. In some variations of the quantum processor, qubits may be encoded in donor sites, which comprises a plurality of donor atoms arranged in a cluster. The qubit in this case is encoded using combinations of quantum properties of the donor atoms in the cluster.

Data qubit elements are encoded in a first set of the plurality of donor atoms and the remaining donor atoms are arranged to facilitate quantum error correction. The qubits encoded on the second set of donor atoms are also referred herein as 'ancilla' qubits.

Data and ancilla qubits are encoded in the nuclear spin of respective donor atoms. As at least 90% of the donor atom pairs in the [001] plane can be tuned to a uniform exchange value, in the quantum processor according to aspects of the present disclosure, donor electron and nuclear spins can be rotated simultaneously using a global magnetic field which can be externally applied to the entire architecture. This provides a substantial advantage in respect to architectures which require local (to each qubit) application of the magnetic field.

A control structure is arranged in the silicon to interact with the data qubits and the ancilla qubits. The arrangement of the control structure allows controlling a plurality of qubits simultaneously. In particular the qubits can be controlled simultaneously in patterns distributed across the matrix. The structure can be controlled to load or unload an electron to or from each of the donor atoms and simultaneously on multiple donor atoms.

Figure 11A:
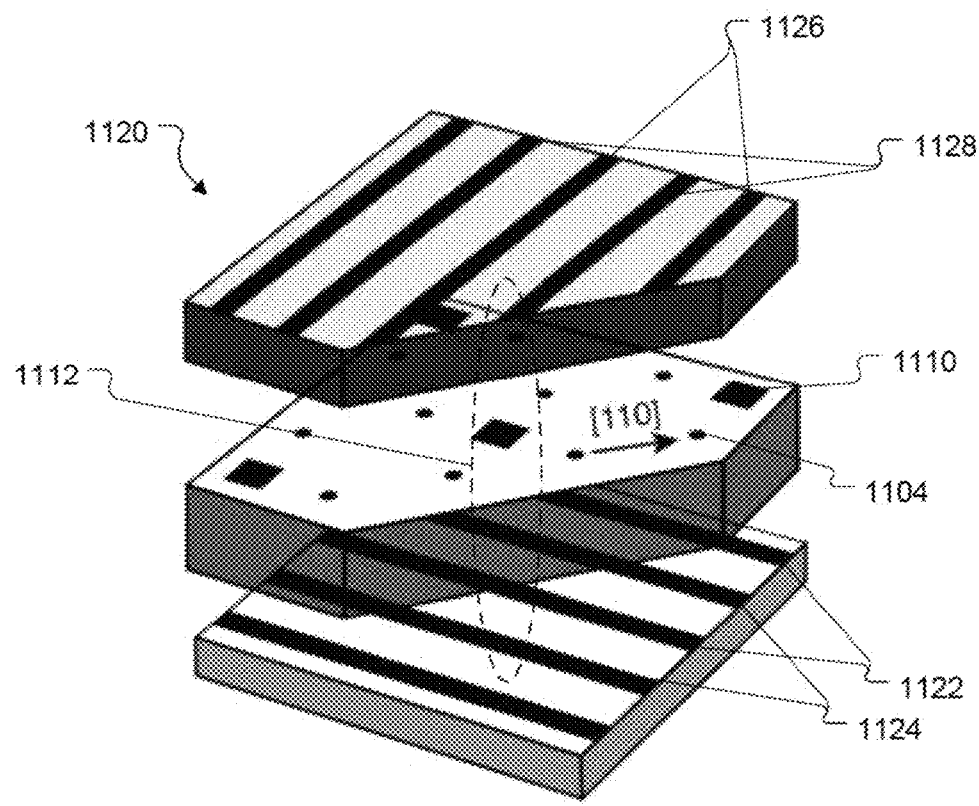
FIGS. 11A-11B are schematic representations of an architecture of a quantum processor in accordance with aspects of the present disclosure.

Referring now to FIG. 11A, there is shown an exploded representation 1120 of a silicon quantum computing structure. Structure 1120 is exploded in three different silicon planes. The structure is formed in an isotopically purified silicon 28 ($^{28}Si$) substrate (for example using the process described with reference to FIG. 9). In particular, a plurality of donor atoms 1104 are embedded in the silicon lattice along the [110] direction. A possible technique to manufacture the structure is to start from a pure silicon wafer and fabricate the structures on each plane exploiting the lithographic capabilities of a scanning tunneling microscope together with silicon epitaxy. In operation the entire device is cooled to the mK regime, operates in a magnetic field of approximately B=21 with an externally applied (global) RF and MW control.

Two sets of control lines extend across the architecture. Control lines are disposed on a plane above the plane comprising the donor atoms and control lines are disposed on a plane below the plane comprising the donor atoms. Control lines are arranged perpendicularly, with respect to each other, in a crisscross configuration. In some implementations the control lines may intersect at an angle different from 90°. The control lines in the two planes do not physically intersect, however they define intersection points where they pass across two vertically aligned portions of the lattice. About some of these intersections, control elements, provided in the form of a heavily doped silicon island 1110, are formed. Each island forms a single electron transistor (SET) with respective control members disposed above and below the island. A pair of these control members acts as source and drain of the transistor, and another pair act as transistor gates.

In structure 1120 the control lines on the bottom plane are separated in two interleaved groups 1022 and 1024. Control lines 1122 act as drains of the SETs and control lines 1124 act as gates of the SETs 1112. A similar configuration is shown for the control lines on the top plane 1126 and 1128, which act respectively as sources and gates of the SETs. Each SET 1112 interacts with one or more donor atoms 1104 through the respective control island 1110. In the embodiment described, each island 1110 is configured to interact with four donor atoms 1104 to form a unitary cell of the architecture. SETs 1112 can be controlled, by applying electrical signals to control lines 1126 to 1124, to load or unload electrons on each donor atom 1104 in the architecture or control the spin orientation of an electron or nucleus of one or more donor atoms. Furthermore, the configuration of the donor atoms 1104 and the control lines allows for loading or unloading of electrons on multiple donor atoms arranged in predetermined patterns simultaneously. For example, electrons could be loaded onto a plurality of donor atoms disposed on a quadrangular pattern.

Figure 11B:
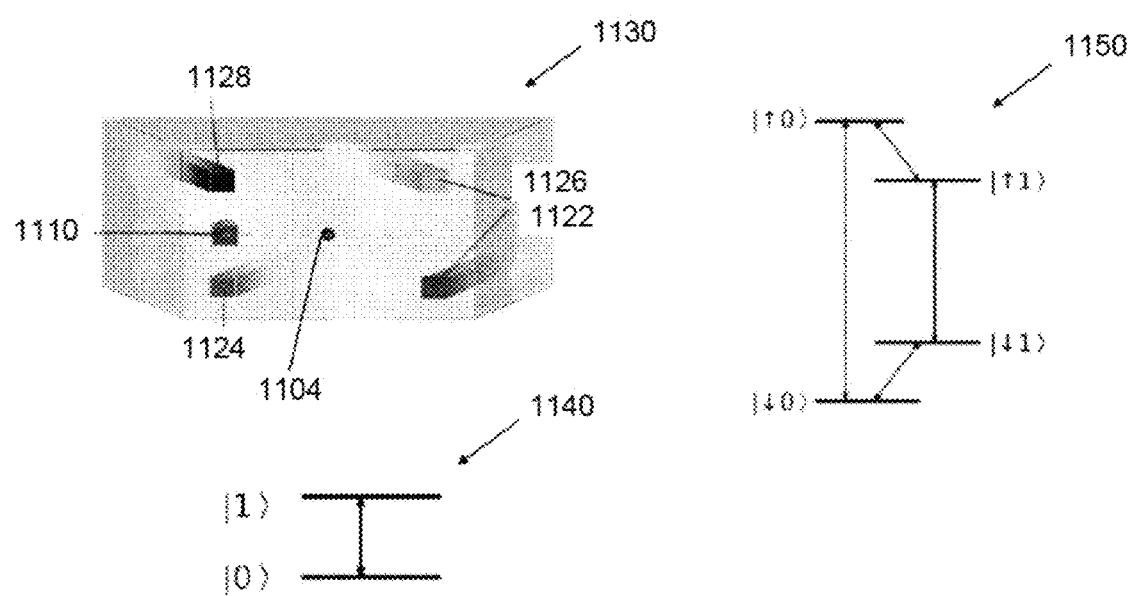

Referring now to FIG. 11B, there is shown a further view 1130 of a donor atom 1104 in a qubit memory state with respective control lines and control island. In this 'memory' state the hyperfine interaction is naturally exactly zero, since no electron is present. Energy diagram 1150 shows the energy levels relevant to ESR/NMR control. The four energy levels have four allowed transitions, two RF NMR transitions, and two microwave ESR transitions. Each of these transitions can be individually targeted to perform single qubit rotations and electron-nuclear spin interactions.

By selectively loading electrons on specific donor atoms, quantum gate operations can be selectively and simultaneously performed across the quantum processor architecture.

Loading an electron onto a given donor location, by pulsing the corresponding gates, endows that a donor with a non-zero hyperfine interaction between the nuclear and electron spin immediately after the electron is loaded. This shifts the resonant frequency of the given donor nuclear spin. A given set of qubits can thus be brought independently into resonance with global RF/MW fields to affect a desired single qubit gate. This is a highly uniform digital change in the hyperfine value, and is governed by the donor-island tunneling process, which can be engineered with atomic precision, and characterized in the system set-up phase.

In the memory state the qubit nuclear spin is far off resonance and not affected by the global control fields.

Two qubit gates between nearest neighbour nuclear spin qubits are also controlled by electron load/unload operations. In the absence of bound electrons the interaction between nuclear spins at these separations is negligible. However, when electrons are loaded on adjacent atoms, in addition to any exchange coupling felt by the electrons, the spin-spin dipole interaction increases by a factor of $(g\mu_B/g_n\mu_n)^2 \approx 3 \times 10^6$ effectively switching the inter-qubit interaction on digitally. Two-qubit logic gates can be decomposed into a well-defined series of single qubit and two-qubit interactions in the presence of the global control fields. All gates, initialisation and read-out are therefore ultimately controlled by the unit cell gate-set and can be carried out with a high degree of parallelisation.

US Patent Publication US20160125311, "Apparatus and method for quantum processing" describes a quantum processor realised in a semiconductor material and method to operate the quantum processor to implement error corrected quantum computation and it is incorporated herein in its entirety.

It will be appreciated that the architectures described in the embodiments above allow for better coupling control via exchange interaction. Having limited variation in exchange interaction values for multiple qubits in a silicon substrate allows for more efficient control of the quantum bits and provides a more feasible path towards an error corrected quantum computing architecture based on donors in silicon.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A quantum processing system comprising:
   a plurality of donor atoms positioned in a silicon crystal substrate, each donor atom positioned at a donor site;
   a plurality of conductive control electrodes arranged about the donor atoms to operate the donor atoms as qubits;
   wherein at least two pairs of nearest neighbour donor atoms of the plurality of donor atoms are arranged along the [110] direction of the silicon crystal substrate and are configured to operate as qubits.

2. The quantum processing system according to claim 1, wherein, each pair of nearest neighbour donor atoms has an exchange coupling value, and
   wherein the maximum variation in the exchange coupling values between pairs of donor atoms is less than a predetermined factor.

3. The quantum processing system of claim 2, wherein the predetermined factor is 10.

4. The quantum processing system of claim 1, wherein the silicon crystal substrate comprising a plurality of donor sites arranged along the [110] direction, each site including a plurality of positions and where a first donor atom is located at a first position of the plurality of positions at a first donor site and a second donor atom is located at a second position of the plurality of positions at a second donor site, and wherein the first position is different from the second position.

5. The quantum processing system of claim 4, wherein each of the donor sites includes six positions.

6. The quantum processing system of claim 1, wherein a distance between donor atoms in a pair of donor atoms is at least 10 nm.

7. The quantum processing system of claim 1, wherein a distance between donor atoms in a pair of donor atoms is between 10 nm and 25 nm.

8. The quantum processing system of claim 4, wherein a two-dimensional protection is provided to exchange coupling J against valley interference when the first donor atom is located at any position of the plurality of positions at the first donor site and the second donor atom is located at any position of the plurality of positions at the second donor site.

9. The quantum processing system of claim 1, further comprising a plurality of control gates arranged about the donor atoms to create detuning fields to increase an exchange coupling value between at least 90% of the pairs of donor atoms to a particular exchange coupling value.

10. A quantum processing system comprising:
a plurality of donor atoms positioned at donor sites in a silicon crystal substrate;
a plurality of conductive control electrodes arranged about the donor atoms to operate the donor atoms as qubits;
wherein at least one pair of nearest neighbour donor atoms is arranged along the [110] direction of the silicon crystal substrate in one of a plurality of possible non-equivalent donor-donor positions with respect to each other, wherein each non-equivalent donor-donor position is associated with a normalized exchange coupling value and variations in the normalized exchange coupling values in respect of all of the plurality of possible non-equivalent donor-donor positions is less than a predetermined factor.

11. The quantum processing system of claim 10, wherein the plurality of non-equivalent donor-donor positions includes ten positions.

12. The quantum processing system of claim 10, wherein a two-dimensional protection is provided to exchange coupling J against valley interference when the at least one pair of nearest neighbour donor atoms are arranged in any one of the plurality of possible non-equivalent donor-donor positions.

13. The quantum processing system of claim 10, wherein the predetermined factor is 10.

14. The quantum processing system of claim 10, wherein a distance between donor atoms in a pair of donor atoms is at least 10 nm.

15. The quantum processing system of claim 10, further comprising a plurality of control gates arranged about the plurality of donor atoms to create detuning fields to increase the exchange coupling value between at least 90% of the pairs of donor atoms to a particular exchange coupling value.

16. A quantum processing system comprising:
a plurality of qubits created by positioning donor atoms in a silicon crystal substrate along the [110] direction such that a difference in magnitude of exchange coupling between pairs of donor atoms is less than a predetermined factor; and
a plurality of control gates arranged about the donor atoms to create detuning fields to increase exchange coupling value between at least 90% of the pairs of donor atoms to a predetermined exchange coupling value.

17. The quantum processing system of claim 16, wherein a pair of control gates of the plurality of control gates is arranged to control a pair of qubits to create a detuning electric field.

18. The quantum processing system of claim 16, wherein the pair of qubits are at least 10 nm apart.

19. The quantum processing system of claim 16, wherein the predetermined factor is 10.

20. The quantum processing system claim 16, further comprising a plurality of conductive control electrodes arranged about the donor atoms to operate the donor atoms as qubits.

* * * * *